United States Patent [19]

Grassl

[11] Patent Number: 4,799,184

[45] Date of Patent: Jan. 17, 1989

[54] CONVOLVER ARANGEMENT WITH ACOUSTIC WAVES

[75] Inventor: Hans P. Grassl, Zornrding, Fed. Rep. of Germany

[73] Assignee: Siemens Aktiengesellschaft, Berlin and Munich, Fed. Rep. of Germany

[21] Appl. No.: 898,375

[22] Filed: Aug. 20, 1986

[30] Foreign Application Priority Data

Aug. 21, 1985 [DE] Fed. Rep. of Germany ....... 3529902

[51] Int. Cl.[4] ........................ G06G 7/195; G06G 7/12; H01L 41/08

[52] U.S. Cl. .................................... 364/821; 333/193; 310/313 R

[58] Field of Search ........................ 364/821, 604, 861; 333/193, 195, 196; 310/313 R, 313 C, 313

[56] References Cited

U.S. PATENT DOCUMENTS

| | | | |
|---|---|---|---|
| 3,770,949 | 11/1973 | Whitehouse et al. | 235/181 |
| 3,931,509 | 1/1976 | Otto | 364/821 |
| 3,935,439 | 1/1976 | Buss et al. | 364/821 |
| 4,224,683 | 9/1980 | Adkins | 364/821 |
| 4,464,597 | 8/1984 | Setsune | 310/313 |
| 4,516,093 | 5/1985 | Nyffeler | 333/196 |
| 4,575,696 | 3/1986 | Hartmann et al. | 333/196 X |
| 4,649,357 | 3/1987 | Nagat et al. | 333/196 |
| 4,649,509 | 3/1987 | Engan | 333/196 |
| 4,701,652 | 10/1987 | Grassl | 333/196 X |

OTHER PUBLICATIONS

IEEE—1982 Ultrasonics Symposium—Swanson et al., "Surface Acoustic Wave Convolver Using Counter-propagating Symmetric and Antisymmetric Waveguide Modes", pp. 130–133.

IEEE—1982 Ultrasonics Symposium—Morgan et al., "Spatial Uniformity of S A W Convolvers", pp. 143–148.

Detranould et al., "Acoustic Convolver Using Multistrip Beamwidth Compressors", 1974 Ultrasonics Symposium Proceedings, IEEE Cat. #74 CHO 896–ISU, pp. 224–227.

Yao, "High Performance Elastic Convolver with Extended Time–Bandwidth Product", 1981 IEEE Ultrasonics Symposium, pp. 181–185.

IEEE Group on Sonics & Ultrasonics, Oct. 27–29, 1982, San Diego, CA—1982 Ultrasonics Symposium Proceedings, B. R. McAvoy, Editor, pp. 113–118.

*Primary Examiner*—Jerry Smith

*Assistant Examiner*—Charles B. Meyer

*Attorney, Agent, or Firm*—Hill, Van Santen, Steadman & Simpson

[57] ABSTRACT

For a convolver to be operated with an input signal E and with two reference signals A and B, two convolver tracks (or four tracks given self-convolution compensation) are required having input transducers connected in parallel for the input signal E in comparison to the transducers for input of the reference signals A and B. All transducers have fundamentally a same design. However, modified split-finger transducers with floating fingers are provided for the input signal transducers, whereas non-modified split-finger transducers are provided for the reference signals.

10 Claims, 2 Drawing Sheets

CONVOLVER ARANGEMENT WITH ACOUSTIC WAVES

RELATED APPLICATION

The present application is related to the following application: "TWO-TRACK CONVOLVER OPERATING WITH ACOUSTIC WAVES AND WITH SUPPRESSION OF SELF-CONVOLUTION SIGNALS", Hans-Peter Grassl—inventor—U.S. Ser. No. 06/898,373 filed 8/20/86.

BACKGROUND OF THE INVENTION

The present invention relates to a convolver arrangement with acoustic waves running in a substrate surface.

Convolvers for acoustic waves are known, for example, from Proc. IEEE, Ultrasonic Symposium (1974), pages 224–227 and (1981), pages 181–185.

Acoustic waves employed in conjunction with such electrical arrangements involve acoustic waves which run in a substrate close to the surface or in the surface. Such acoustic waves are known as Rayleigh Waves, Bluestein Waves, Love Waves, SSBW Waves, SABW Waves and the like, and which shall be referred to in general below as surface waves (although only the two first types of waves are surface waves in the strictest sense).

A surface wave convolver is an electrical device for extremely high frequencies, particularly beginning with the MHz range. Such a convolver is employed for processing, for example, binary orthogonal keying (BOK) signals.

A convolver is a combination of a plurality of structures arranged on the one surface of a substrate, for example, lithium niobate. These include an interdigital structure as an input transducer for the input signal to be processed. Also included is an interdigital transducer as an input transducer for a reference signal. These two input transducers are arranged opposite one another in the direction of or along the axis of the track of the acoustic waves. The integration electrode is situated between them, this integration electrode usually being a strip arranged on the substrate surface. The width of the integration electrode measured at right angles to the axis of the track of the wave propagation is usually considerably smaller than the width or finger length of the input digital transducer measured parallel thereto. For matching or adapting these extremely different input or output apertures of the input transducer and the integration electrode residing opposite one another, a beam compression structure is inserted between these structures for matching the apertures. The electrical output of such a convolver is a terminal connected to the integration electrode. From an input signal and a reference signal, such a convolver supplies a convolution signal of these two input signals.

Disturbing effects which are based on undesired, additional functions of individual or of a plurality of structures of the arrangement occur in surface wave arrangements as well as in convolvers. For example, reflections of the acoustic waves and the transducer fingers are known as a disturbing effect. A technique which is effective against these reflections is the formation of those interdigital transducers which can effect the disturbing appearance of reflections as split-finger structures. Specifically, in a convolver a self-convolution signal can occur as a noise signal, i.e., a convolution signal is formed of the acoustic wave of the signal proceeding as desired in the one direction of the convolver and of the wave of this input signal reflected at the input transducer for the reference signal which undesirably runs in the opposite direction. In order to eliminate this type of disturbance, two convolver structures as set forth above have been arranged together on one and the same surface of the substrate body, their individual structures being electrically connected to one another such that an elimination of the self-convolution signal is achieved. This electrical circuit diagram is essentially comprised such that the two input transducers for the input signal or for the reference signal are connected parallel to one another. The two integration electrodes are likewise connected in parallel. These two parallel-interconnected convolver structures interact such that reflections at the input transducers are prevented in the final result. This corresponds to a suppression of the regeneration effect and can be achieved by a corresponding geometrical arrangement of inter-related input transducers for the reference signal and integration electrode which is effective for the acoustic wave, namely a geometrical arrangement differing by Lambda/2 in the final result. For example, the respective spacings between the end of the integration electrode and the beginning of the input transducer for the reference signal can differ in size by this value Lambda/2 (or uneven multiples of Lambda/2). An equivalent technique is to provide such a spacing difference at the input side for the input signal. A likewise equivalent technique is to fashion the two interdigital transducers for the input signal or for the reference signal which form a pair of input transducers in terms of their interdigital structure such that they respectively emit such an acoustic wave, i.e., together emit waves between which a 180° phase shift is present. What is achieved by means of such techniques is that the waves incident on a transducer pair always generate signals therein whose sum is zero. A regeneration, i.e., a reemission of waves, is thus prevented, these waves potentially appearing as a consequence of a voltage induced at the terminating impedance which terminates the interconnection of a transducer pair.

Corresponding matching networks are required for the feed of the input signal and of the reference signal. It is obviously advantagous if identical matching networks, namely the simplest possible matching networks, could be used for the input signal and for the reference signal. The simplest matching network is an inductance. This is not a problem both for a simple convolver as well as a convolver as set forth above comprising two convolver structures for compensation of the self-convolution signal. Either only one individual input transducer is provided at each end, or two input transducers connected in parallel which form a transducer pair are provided. Let it be pointed out that such a parallel connection can also be structurally constructed, i.e., instead of two individual (input) interdigital transducers connected in parallel, a single interdigital transducer (essentially twice as broad) is employable. This transducer is the input transducer for the two convolver structures (of the convolver with compensation of the self-convolution). Instead of such an interdigital transducer dimensioned twice as broad, it can also be provided that an interposed multi-strip coupler is inserted, this causing a coupling between the input transducer and the two convolver structures which has a compensating effect in view of the self-convolution signal.

Corresponding matching networks which are not to be included among the surface wave convolvers in the narrowest sense are required for the feed of the input signal and of the reference signals. However, it is necessary that the corresponding transducer of the convolvers is matched to the matching network, or that the respective matching network is matched to the corresponding convolver input transducer. This leads to a corresponding multiplicity.

SUMMARY OF THE INVENTION

An object of the present invention is to specify techniques for the convolution of an input signal (E) with two reference signals (A, B) which cause no significant added expense in comparison to known arrangements (having only one reference signal). The invention should also be suitable for arrangements with self-convolution compensation.

This object is achieved with the convolver arrangement wherein two integration electrodes are provided for the convolution of only one input signal with two reference signals. An input signal interdigital transducer is provided for each of the integration electrodes, and with the two transducers being connected in parallel to the input signal. An interdigital transducer is provided for each of the reference signals adjacent an opposite end of each of the integration electrodes. The integration electrodes have an output for each of two convolution signals which arise. The reference signals connect to each of the respective interdigital transducers, and an input impedance of at least an approximately identical value is provided at the input of the parallel connection of the two input signal interdigital transducers as is present at the input of each of the individual interdigital transducers for each of the reference signals. The interdigital transducers have a substantially similar design, except that the interdigital transducers for the input signal differ from the interdigital transducers for the reference signals in the following manner. A floating finger is provided through an electrical interruption of the floating finger relative to the respective bus bar. Preferably, the second finger following one end of at least one of the comb structures of the interdigital transducers for the input signal is employed as the floating finger, such as shown in FIG. 3.

For the convolver arrangement comprising two reference signals and an input signal, the invention is based on the idea of providing only such input transducers, or of being able to utilize the advantageous rule for producing the overall design for the convolver thereof, such that all input transducers of the arrangement have fundamentally the same design. What is meant by "fundamentally" same design is that all input transducers employed in a corresponding convolver need not be completely identical, but only differ in terms of fine distinctions. The term "fine distinctions" in the sense of the invention is not to be considered as secondary in view of all points of view. This fine distinction of the difference has an electrically decisive effect in the invention. With respect to the technological manufacture of the corresponding transducer, this fine distinction does not represent anything that could cause substantial additional technological or computer expense.

A concept of the invention is to base the design with respect to the input transducers, i.e. both the transducers for the input signal as well as those for the reference signals, on the split-finger principal. Given a convolver arrangement of the invention, the input transducers for the reference signals are split-finger interdigital transducers in the traditional sense. The input transducers for the input signal would likewise be split-finger transducers when their floating fingers are electrically connected, just like the respectively neighboring interdigital fingers in the respective one or other comb structure. If all input transducers are not first uniformly manufactured and subsequently every second finger is not parted by, for example, burning off, then these two transducer constructions differ from one another only in view of the floating fingers, and can be advantageously manufactured with two patterns—one pattern for the reference signal transducers, and one pattern for the input signal transducers. However, let it again be pointed out that both patterns are based on the same design, i.e., the filter design only has to be made once for both patterns. What is meant by a pattern is either a mask or a respective program which is to be input into the automatically functioning exposure means for the photolithographic manufacture of the finger structures.

DESCRIPTION OF THE PREFERRED EMBODIMENTS

Figure 1:
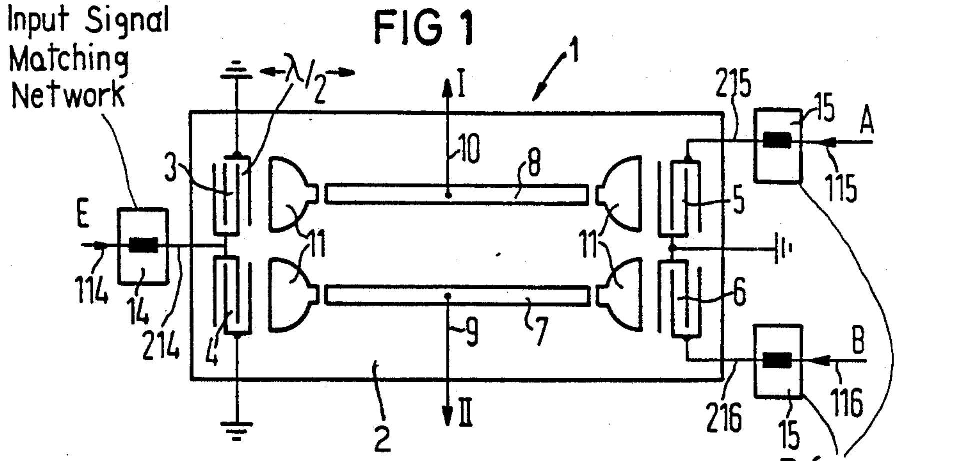
FIG. 1 shows a first convolver arrangement at which the invention is to be realized.

FIG. 1 shows a first embodiment of a convolver arrangement 1 relevant for the invention. It has two input signal transducers 3, 4 and two reference signal transducers 5, 6. Reference numerals 7 and 8 each reference an integration electrode which, as is known, are strip-shaped metallization coatings on the surface of the substrate member 2. Reference numeral 11 indicates known beam compressors adapted to the individual situation. These can be surface coatings and/or strip structures. Reference numerals 9 and 10 show the two output terminals of the convolver for the convolution signal I and for the convolution signal II. Reference numeral 14 indicates an input signal matching network having an input 114 for the input signal. Reference numeral 15 shows respective reference signal matching networks for the reference signal A at the input 115 and for the reference signal B at the input 116.

As may be seen from FIG. 1, the two input signal transducers 3 and 4 are connected in parallel. One of the comb structures from each of the transducers 3 and 4 are connected together and to the output 214 of the input signal matching network 14. The two other comb structures of the transducers 3 and 4 are connected to a reference potential or to ground. In the reference signal transducers 5 and 6, one of the comb structures of each are again connected to one another and also to the reference potential or ground. The other two comb structures of each are connected to the respective output 215 or 216 of the reference signal matching network 15.

Figure 2:
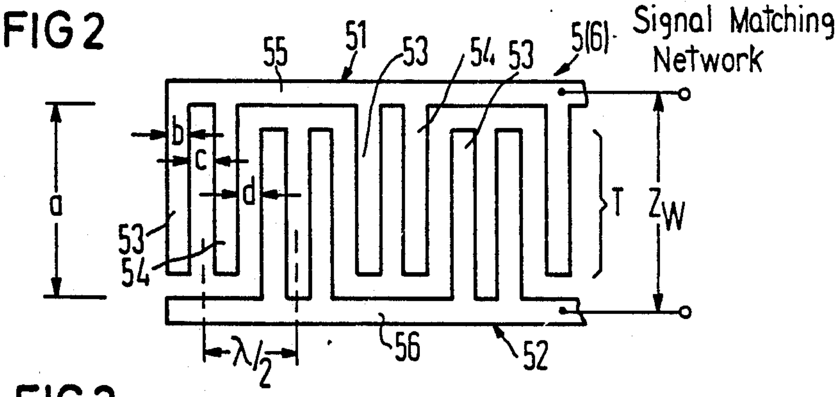
FIG. 2 shows a known split-finger transducer of the type to be employed for the reference signal input transducers in an arrangement of FIG. 1 or FIG. 5.

In accordance with a feature of the invention, transducers of the type shown in FIG. 2 are to be provided as reference signal transducers 5 and 6. The transducer 5 or 6 shown in FIG. 2 is a split-finger interdigital transducer formed of the two comb structures 51 and 52. The split-finger pairs 53, 54 engage into one another (as shown). Bus bars 55 and 56 are also shown. Between the terminals schematically shown in FIG. 2 or between these two comb structures 51 and 52, the transducer 5 has a given impedance $Z_w$ or an impedance $Z_w$ corresponding to the design. This impedance $Z_w$ and the output impedance of the matching networks 15 and 16 at the outputs 215 and 216 are matched to one another, as is usual. The two comb structures 51 and 52, i.e. the transducer, essentially has compacitive impedance.

In accordance with the known prior art, different techniques are provided for the input signal side of the convolver, for example, either different output impedance values of the matching network 14 or a different design for the transducers 3 and 4 leading to a different value of impedance.

Figure 3:
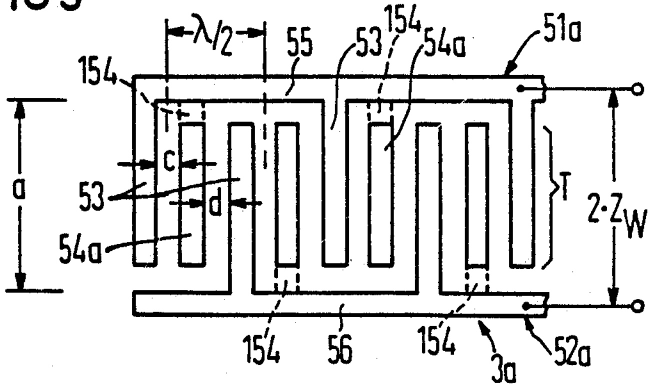
FIG. 3 shows a transducer derived from the transducer of FIG. 2 which is fundamentally identical in terms of design, and is of a type to be provided for the input signal input transducers in an arrangement of FIG. 1 or FIG. 5 in accordance with the invention.

In the invention, by contrast, one respective transducer *3a* of FIG. 3 (or *3b* in FIG. 4) is employed for each of the transducers 3 and 4. It can be seen that the transducer 5 of FIG. 2 and the transducer *3a* (or *3b*) have a fundamentally identical design. In particular, the geometrical width or the aperture of the transducers *3a* and 5 coincide. The distribution of the fingers 53 and 54 or 53 and *54a* is also identical within the respective track T of the individual transducer. This track T is the strip of the transducer within which excited acoustic waves appear on the basis of the signal feed of the transducer or of its inter-engaging digital structures 51 and 52 or *51a* and *52a*. Let it be pointed out that, contrary to the illustrations in FIGS. 2 and 3, the width of the track T makes up about 95 to 99% of the space a available between the bus bars 55 and 56 in the inside of the transducer.

The geometrical or structural difference of the transducer of FIG. 3 on the one hand relative to the transducer of FIG. 2 on the other hand which is essential to the invention is that the fingers *54a* are floating fingers in comparison to the fingers 54, i.e., are fingers not connected to any of the aforementioned potentials.

The fingers 53 and 54 ar split fingers and usually have a width b of 2/8. The intermediate spacing c between the split fingers 53, 54 has the same dimension. The spacings d present between the outside edge of the finger 54 and the electrically outside edge of the finger 53 lying adjacent opposite this edge likewise have the same dimension $\lambda/8$. These spacings are shown in FIG. 2. They are analogously shown in FIG. 3 as well, even though the respective finger *54a* is a floating finger. For the piezo-electric generation of the surface wave, this floating finger in the transducer of FIG. 3 would not be necessary in and of itself. Its presence, however, serves the purpose of uniformity. In particular, the presence of the floating finger *54a* causes a reflection in the transducer of FIG. 3 to be suppressed in the same way as is known to be the case for a split finger arrangement of the transducer of FIG. 2.

As may be seen from the comparison of FIGS. 2 and 3, the difference can be expressed such that an extremely small length sub-section, namely the contact location of the finger 54 to its bus bar 55 or 56 is omitted in the transducer of FIG. 3. This omission 154 is indicated with broken lines at the floating fingers *54a*.

At its illustrated terminals, a transducer of FIG. 3 has an impedance of at least approximately $2 \cdot Z_w$.

In the convolver of FIG. 1, for example, one respective transducer *3a* of FIG. 3 is provided as input signal transducer 3 and one transducer *3a* for 4. The result of the parallel connection of two transducers *3a* is that the overall input impedance for the input signal E is again $Z_w$. This means that a matching network 15 is likewise to be employed at the input signal side. This means that three identical networks 15 can be employed for the convolver of the invention, even though a transducer structure having a fundamentally uniform design is employable for the (input signal and the reference signal) interdigital transducer. As prescribed, this compactly constructed convolver of FIG. 1 supplies the two convolution signals I and II from the input signal E and the reference signals A and B, and the convolver 1 nonetheless has interdigital transducers that are to be understood as coinciding for this invention.

Apart from the fingers 53 connected to the respective bus bar 55, 56, the inter-digital structure shown in FIG. 3 and provided as an embodiment *3a* for the input signal transducers 3 and 4 has the individual floating fingers *54a*. The improved embodiment of FIG. 4, which is an alternative to the embodiment of FIG. 3, is based on the same principal underlying the invention. The transducer referenced *3b* in FIG. 4 has the details provided with the corresponding reference characters which are already set forth above. In the embodiment *3b*, however, the additional connecting bridges 254 are provided, these electrically connecting neighboring floating fingers *54a* with one another. Developments of such a transducer *3b* can be such that all floating fingers *54a* of the transducer are electrically connected to one another by these connecting bridges. The effect which is thus pursued in the framework of the invention, however, can already be at least largely achieved by connecting only two neighboring fingers *54a* to one another. For example, only the connecting bridges 254 shown with solid lines are present (the connecting bridges 254 shown with broken lines are omitted for this embodiment). An alternative design would, for example, be to connect three or even more neighboring floating fingers *54a* with such connecting bridges 254, or to connect a different plurality of neighboring floating fingers *54a* to one another in, for example, a transducer *3b*.

Figure 4:
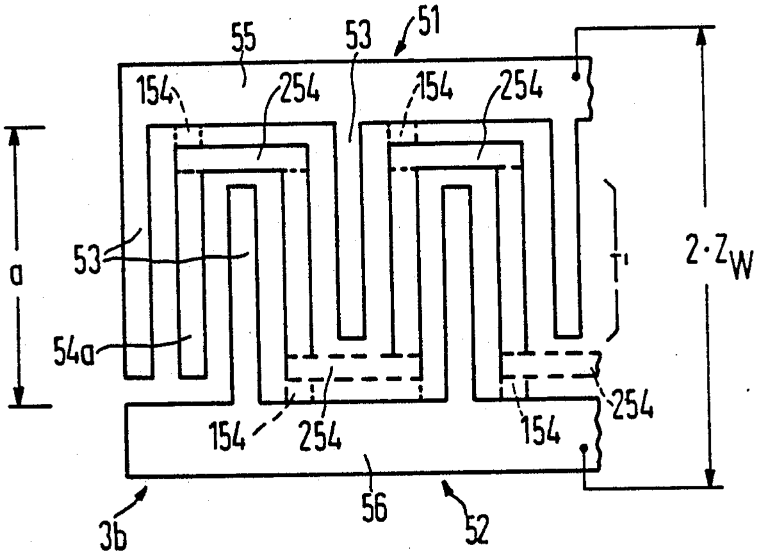
FIG. 4 shows a modification of a transducer of FIG. 3.

Improvements in view of necessarily occurring interdigital reflections at the (floating) fingers can be achieved with the embodiment of FIG. 4. More generally, these improvements can be explained as suppressions of a disturbing effect based on reflections, namely a disturbing effect such as can occur given the employment of a transducer of FIG. 3 in a convolver arrangement on which the present invention is based.

A structural design which is similar and which likewise has a background for other filters is known from "Ultrasonics International", 1985 (London), pages 1–6. Connecting bridges for fingers floating per se are provided therein in conjunction with unidirectional transducers.

For an embodiment in accordance with FIG. 4, of course, the omissions referenced 154 in FIG. 3 are to be made somewhat larger, i.e. the width T' is reduced somewhat in comparison to the dimension a in order to create space for the connecting bridges 254. This, however, is not a problem within the framework of the invention.

Figure 5:
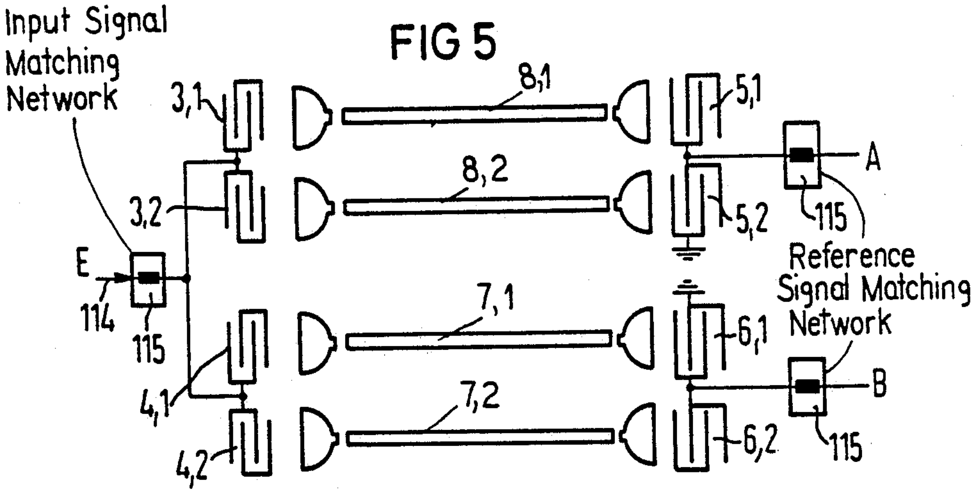
FIG. 5 shows a further convolver arrangement wherein the invention is applied.

FIG. 5 shows an improvement of a convolver arrangement of FIG. 1. FIG. 5 is a convolver arrangement having four individual convolvers (instead of two convolvers as in FIG. 1).

As is known, the convolver arrangement of FIG. 5 serves the purpose of having no signal component —at least insofar as possible —based on self-convolution in the output of the convolution signals I and II. It is known to provide for that purpose a phase difference corresponding to half a wave length in the two convolvers with reference signal input transducers (for the reference signal I or for the reference signal II) connected in parallel. Thus, the signal of the self-convolution of this convolver pair is compensated in the output for the convolution signal I or II. For example, given in-phase feed with the input transducers 3, 1 and 3, 2 or 4, 1 and 4, 2 operated in parallel for the input signal, the feed of the reference signal into the two transducers 5, 1 and 5, 2 or 6, 1 and 6, 2 connected in parallel for the reference signals A or B occurs in anti-phase fashion. As a substitute, the structural format can also be selected such that the corresponding anti-phase feed occurs into the integration electrodes 8, 1 and 8, 2 or 7, 1 and 7, 2.

As in the case of the embodiment of a convolver arrangement of FIG. 1, also present given this embodiment of a convolver arrangement according to FIG. 5 is that two transducer structures 3, 1 and 3, 2 or 4, 1 and 4, 2 are connected in parallel overall at the input signal side. In contrast, thereto, no parallel connection with respect to one another is respectively provided for the reference signals A and B. A parallel connection of the transducers 5, 1 and 5, 2 or 6, 1 and 6, 2 is only present for the reference signal A on the one hand and for the reference signal B on the other hand. A transducer of FIG. 3 or FIG. 4 is provided for the transducers 5, 1 and 5, 2 as well as 6, 1 and 6, 2 of the reference signals A and B. However, a transducer of FIG. 2 is provided for the transducers 3, 1 through 4, 2 of the input signal side and the result of the invention is again achieved since the input impedance of a same size as for the reference signals A and B is present at the input signal side for the input signal E in the convolver arrangement. The same matching network 115 can likewise be employed for the three signals E, A, and B in the embodiment of FIG. 5.

Although various minor changes and modifications might be proposed by those skilled in the art, it will be understood that I wish to include within the claims of the patent warranted hereon all such changes and modifications as reasonably come within my contribution to the art.

I claim as my invention:

1. A convolver arrangement in which acoustic waves run in a surface of a substrate member, comprising:

first and second integration electrodes with respective first and second input signal interdigital transducers arranged at one end of each of the respective first and second integration electrodes, and first and second reference signal interdigital transducers at respective opposite ends of the two integration electrodes, and wherein a single input signal is connected to a parallel connection of the first and second input signal interdigital transducers, and first and second reference signals are connected to the respective first and second reference signal interdigital transducers so that convolution of only one input signal with two reference signals is provided;

the first and second integration electrodes each having respective first and second convolution signal outputs;

each of the first and second input signal interdigital transducers having a same first input impedance, and each of the individual reference signal interdigital transducers having a same second input impedance;

the first and second input impedances being chosen such that an input impedance of the parallel connection of the first and second input signal interdigital transducers has approximately a same value as said same second input impedance of each of the individual reference signal interdigital transducers;

both the input signal and reference signal interdigital transducers having a fundamentally similar design structure except that the reference signal interdigital transducers are split-finger interdigital transducers with alternating finger pairs, whereas the input signal interdigital transducers are like split-finger interdigital transducers with finger pairs but wherein one of the fingers of each pair is provided as a floating finger through provision of an electrical interruption of the floating finger relative to a respective bus bar to which it would normally connect, but for the electrical interruption.

2. A convolver arrangement according to claim 1 wherein the input signal interdigital transducers have finger spacings and finger lengths substantially identical to finger spacings and finger lengths in the reference signal interdigital transducers.

3. A convolver arrangement according to claim 1 wherein at least two floating fingers are interconnected by a connecting bridge.

4. A convolver arrangement according to claim 3 wherein more than two floating fingers are mutually connected to one another by a connecting bridge.

5. A convolver arrangement wherein acoustic waves run in a surface of a substrate member, comprising:

first, second, third, and fourth integration electrodes;

first, second, third, and fourth respective input signal transducers arranged at respective first ends of the first, second, third, and fourth integration electrodes, the four input signal interdigital transducers all being connected in parallel to receive an input signal;

first, second, third, and fourth reference signal interdigital transducers at respective opposite ends of the first, second, third, and fourth integration electrodes, the first and second reference signal interdigital transducers being connected in parallel to receive a first reference signal and the third and fourth interdigital transducers being connected in parallel to receive a second reference signal so that the convolution of only one input signal with two reference signals is provided for;

an input impedance formed at the parallel connection of the first, second, third, and fourth input signal interdigital transducers being approximately the same as an input impedance to the parallel connection of the first and second reference signal interdigital transducers and an input impedance to the parallel connection of the third and fourth reference signal interdigital transducers; and all interdigital transducers having a substantially similar design structure except that the reference signal interdigital transducers are like split-finger interdigital transducers with alternating finger pairs whereas the input signal interdigital transducers are like split-finger interdigital transducers with finger pairs but wherein one of the fingers of each pair is provided as a floating finger by providing an electrical interruption between the floating finger and the respective bus bar.

6. A convolver arrangement according to claim 5 wherein the input signal interdigital transducers have finger spacings and finger lengths substantially identical to finger spacings and finger lengths of the reference signal interdigital transducers.

7. A convolver arrangement according to claim 5 wherein at least two floating fingers are interconnected by a connecting bridge.

8. A convolver arrangement according to claim 7 wherein more than two floating fingers are mutually connected to one another by a connecting bridge.

9. A convolver arrangement in which acoustic waves run at a surface of a substrate member, comprising:

first and second integration electrodes with respective first and second input signal interdigital transducers arranged at one end of each of the respective first and second integration electrodes, and first and second reference signal interdigital transducers at respective opposite ends of the two integration electrodes, and wherein a single input signal is connected to a parallel connection of the first and second input signal interdigital transducers, and first and second reference signals are connected to the respective first and second reference signal interdigital transducers so that convolution of only one input signal with two reference signals is provided;

the first and second integration electrodes each having respective first and second convolution signal outputs;

each of the first and second input signal interdigital transducers having a same first input impedance, and each of the individual reference signal interdigital transducers having a same second input impedance;

the first and second input impedances being chosen such that an input impedance of the parallel connection of the first and second input signal interdigital transducers has approximately a same value as said same second input impedance of each of the individual reference signal interdigital transducers;

both the input signal and reference signal interdigital transducers having finger pairs but wherein the input signal interdigital transducers have floating fingers through provision of an electrical interruption of the floating finger relative to a respective bus bar to which it would normally connect, but for the electrical interruption.

10. A convolver arrangement wherein acoustic waves run at a surface of a substrate member, comprising:

first, second, third, and fourth integration electrodes;

first, second, third, and fourth respective input signal transducers arranged at respective first ends of the first, second, third, and fourth integration electrodes, the four input signal interdigital transducers all being connected in parallel to receive an input signal;

first, second, third, and fourth reference signal interdigital transducers at respective opposite ends of the first, second, third, and fourth integration electrodes and with the first and second references signal interdigital transducers being connected in parallel to receive a first reference signal and the third and fourth interdigital transducers being connected in parallel to receive a second reference signal so that the convolution of only one input signal with two reference signals is provided for;

an input impedance formed at the parallel connection of the first, second, third, and fourth input signal interdigital transducers being approximately the same as an input impedance to the parallel connection of the first and second reference signal interdigital transducers and an input impedance to the parallel connection of the third and fourth reference signal interdigital transducers; and all interdigital transducers having finger pairs but wherein the input signal interdigital transducers have floating fingers by providing an electrical interruption between the floating finger and the respective bus bar.

* * * * *